United States Patent
Micielli et al.

(10) Patent No.: US 10,680,594 B2
(45) Date of Patent: Jun. 9, 2020

(54) COMPARATOR CIRCUIT WITH FEEDBACK AND METHOD OF OPERATION

(71) Applicant: NXP USA, INC., Austin, TX (US)

(72) Inventors: Christopher James Micielli, Austin, TX (US); Srikanth Jagannathan, Austin, TX (US); Manmohan Rana, Ghaziabad (IN); Carl Culshaw, Wigan (GB)

(73) Assignee: NXP USA, Inc., Austin, TX (US)

( * ) Notice: Subject to any disclaimer, the term of this patent is extended or adjusted under 35 U.S.C. 154(b) by 60 days.

(21) Appl. No.: 16/030,945

(22) Filed: Jul. 10, 2018

(65) Prior Publication Data

US 2020/0021279 A1    Jan. 16, 2020

(51) Int. Cl.
| | |
|---|---|
| *H03K 5/24* | (2006.01) |
| *G01R 31/40* | (2020.01) |
| *H03K 3/037* | (2006.01) |
| *H03K 19/20* | (2006.01) |

(52) U.S. Cl.
CPC ............. *H03K 5/24* (2013.01); *G01R 31/40* (2013.01); *H03K 3/037* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 4,410,813 A | * | 10/1983 | Barker .............. H03K 19/0948 327/535 |
| 4,590,391 A | | 5/1986 | Valley |
| 6,147,517 A | | 11/2000 | AlNahas et al. |
| 7,003,421 B1 | | 2/2006 | Allen, III et al. |
| 7,030,682 B2 | | 4/2006 | Tobita |
| 7,639,049 B2 | | 12/2009 | Ohira |
| 9,543,752 B2 | | 1/2017 | Westra et al. |
| 2005/0218943 A1 | | 10/2005 | Padhye et al. |
| 2015/0117120 A1 | | 4/2015 | Barth, Jr. et al. |
| 2016/0098333 A1 | | 4/2016 | Hershman |
| 2016/0276988 A1 | | 9/2016 | Won et al. |

OTHER PUBLICATIONS

U.S. Appl. No. 15/906,255; Micielli, Christopher James, et al.; filed Feb. 28, 2018 "Integrated Circuitry and Methods for Reducing Leakage Current".

\* cited by examiner

*Primary Examiner* — Jas A Sanghera

(57) ABSTRACT

A comparator circuit includes a first transistor have a control electrode coupled to a first input voltage, a first current electrode coupled to a second input voltage, and a second current electrode coupled to a first circuit node. The circuit also includes a first inverter coupled to a first voltage supply terminal and having a first input coupled to the first circuit node and an output, a second transistor having a control electrode coupled to the output of the first inverter, and an active resistive element coupled in series between the first circuit node and a first current electrode of the second transistor.

20 Claims, 4 Drawing Sheets

US 10,680,594 B2

COMPARATOR CIRCUIT WITH FEEDBACK AND METHOD OF OPERATION

BACKGROUND

Field

This disclosure relates generally to integrated circuits, and more specifically, to a comparator circuit with feedback.

Related Art

In System on Chips (SoCs), it is important that the supply voltages provided to the SoC be compatible with the SoC, because otherwise, damage can result to the SoC. Therefore, it is desirable to alert a user or customer when supply voltage incompatibilities occur. Also, during some hacking events, the supply voltage is altered in order to make a device or System on Chip (SoC) more vulnerable. For example, fault injection attacks are commonly performed by tampering with the supply voltage in order to maliciously alter software execution. Therefore, it is useful, for safety and security purposes, to have a comparator able to detect such variations in the supply voltage. However, using a traditional comparator which compares two input voltages, it is difficult to compare the two voltages when either or both voltages are equal to or higher than the comparator supply voltage. Therefore, these traditional comparators are not reliable for comparisons in which two inputs are close to the supply. Furthermore, such comparators need to operate at low power since they should always be on.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a low power coarse comparator compares two direct-current (DC) voltage levels. This comparator may be used, for example, to detect an over voltage situation. This comparator consumes negligible DC current due to a feedback mechanism that automatically disables the comparator when the output switches. In this manner, the comparator consumes low power and can remain on. The comparator circuit can be used to detect a supply voltage tampering or incompatibility event and assert a fault indicator in response thereto. Furthermore, such a comparator circuit, along with a digital controller, can be used to detect supply voltage incompatibility for an entire pad segment.

Figure 1:
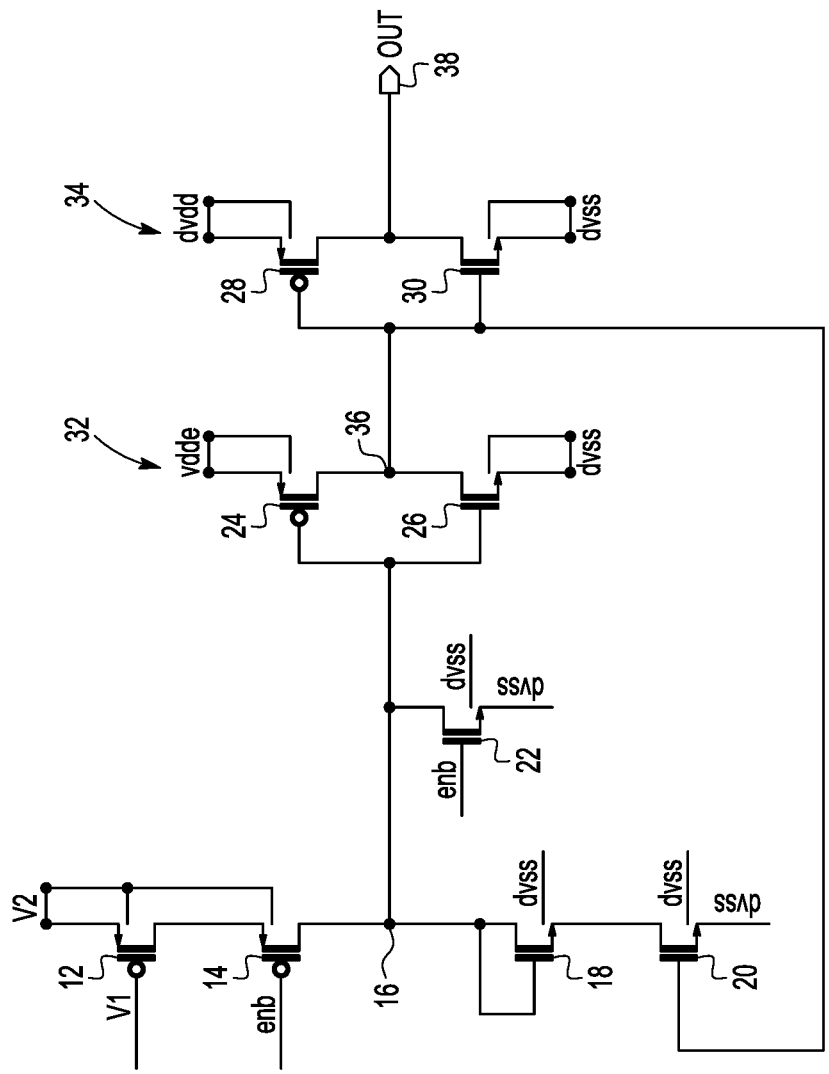
FIG. 1 illustrates, in schematic form, a comparator circuit in accordance with one embodiment of the present invention.

FIG. 1 illustrates, in schematic form, a comparator circuit 10 in accordance with one embodiment of the present invention. Comparator circuit 10 includes P-channel transistors 12, 14, 24, and 28 and N-channel transistors 18, 20, 22, 26, and 30. A control electrode of transistor 12 is coupled to receive a first DC input voltage, V1, and a first current electrode of transistor 12 is coupled to receive a second DC input voltage, V2. The first DC input V1 corresponds to an inverting input of comparator circuit 10, and the second DC input V2 corresponds to a non-inverting input of comparator circuit 10. Transistor 14 has a first current electrode coupled to a second current electrode of transistor 12, a control electrode coupled to receive enb, and a second current electrode coupled to circuit node 16. Note that an active high enable signal, en, can be used to enable comparator circuit 10, and enb is the inverse of en (and thus an active low enable signal for comparator circuit 10). Body terminals of transistors 12 and 14 are coupled to V2. Transistor 18 has a first current electrode coupled to node 16, a control electrode coupled to node 16, and a second current electrode. Transistor 20 has a first current electrode coupled to the second current electrode of transistor 18, a control electrode coupled to receive a feedback signal from a circuit node 36, and a second current electrode coupled to a first voltage supply terminal, dvss. The body terminals of transistors 18 and 20 are coupled to dvss. Transistor 22 has a first current electrode coupled to node 16, a control electrode coupled to receive enb, a second current electrode coupled to dvss, and a body terminal coupled to dvss.

Continuing with FIG. 1, transistor 24 has a first current electrode and body terminal coupled to a second voltage supply terminal, vdde, a control electrode coupled to node 16, and a second current electrode coupled to node 36. Transistor 26 has a first current electrode coupled to node 36, a control electrode coupled to node 16, and a second current electrode and body terminal coupled to dvss. Transistor 28 has a first current electrode and body terminal coupled to a third voltage supply terminal, dvdd, a control electrode coupled to node 36, and a second current electrode coupled to an output node, out 38, of comparator circuit 10. Transistor 30 has a first current electrode coupled to out 38, a control electrode coupled to node 36, and a second current electrode and body terminal coupled to dvss. In the current embodiment, vdde is greater than dvdd which are greater than dvss. Transistors 24 and 26 operate as an inverter 32, and transistors 28 and 30 operate as an inverter 34. Inverter 32 inverts the polarity of node 16 and provides the inverted value to inverter 34. Inverter 34 inverts the polarity of node 36 and provides out 38 with the correct polarity (matching the polarity of node 16) but level shifted from vdde to dvdd. Node 36 corresponds to an output of inverter 32, which provides the feedback signal to the control electrode of transistor 18.

In operation, while V2 is less than (V1+threshold voltage of transistor 12, Vtp), the output is low, i.e. dvss, and when V2 rises above (V1+Vtp), the output switches to high, i.e. dvdd. The first input, V1, is fixed by being coupled to vdde, and the second input, V2, is monitored to determine when it surpasses V1 by Vtp. Initially, en is 0 (meaning enb is 1). This maintains transistor 14 off and transistor 22 on. Transistor 22 pulls node 16 down to dvss, causing node 36 to go high. With node 36 high, the feedback to transistor 20 turns on transistor 20. With transistor 20 on, node 16 is pulled down, via transistor 18, to ground.

Next, comparator circuit 10 is enabled by changing en to 1 and, thus, enb to 0. This turns off transistor 22 and turns on transistor 14. At this point, comparator circuit 10 is in its monitoring state. So long as V2 is less than or equal to V1+Vtp, transistor 12 is off. The feedback from node 36 to transistor 20 is still held high so transistor 20 is maintained on and pulls down node 16. While comparator circuit 10 is in its monitoring state, there is no DC current in the comparator.

When V2 goes above V1 by Vtp, transistor 12 turns on and, with enb being 0, transistor 14 is still on. Transistor 14 begins to slowly ramp up node 16. Since transistors 18 and 20 are still on and pulling down on node 16, there is contention on node 16. However, as node 16 increases, due to the feedback provided by node 36, transistor 20 starts turning off. In the illustrated embodiment, transistor 18 is coupled as a resistive element and operates as a weak load. Therefore, node 16 is eventually pulled up by transistors 12 and 14 to V2. This causes the feedback at node 36 to go low, turning off transistor 20, and causes out 38 to go high, indicating a fault corresponding to an over voltage condition. With transistor 20 off, there is no DC current path anymore. With node 16 now pulled up to V2, comparator circuit 10 has to be reset by way of negating and subsequently asserting en. Therefore, once out 38 changes state from low to high, en has to be toggled to reset comparator 10 again into its monitoring state. In this manner, out 38 will only be triggered (asserted) once since the enabling of comparator circuit 10 to indicate a fault.

Transistor 18 is coupled as a resistive element and represents the load of comparator circuit 10. Alternatively, any resistive element or active load can be used which provides a weak load that can be pulled by the p-channel transistors 12 and 14. As illustrated in FIG. 1, a predetermined margin of Vtp is used in the comparison of V1 and V2. In an alternate embodiment, Vtp could be generated using a resistor divider and used instead of V2 in the comparator. In this case, there would be no Vtp margin in the comparison.

Figure 2:
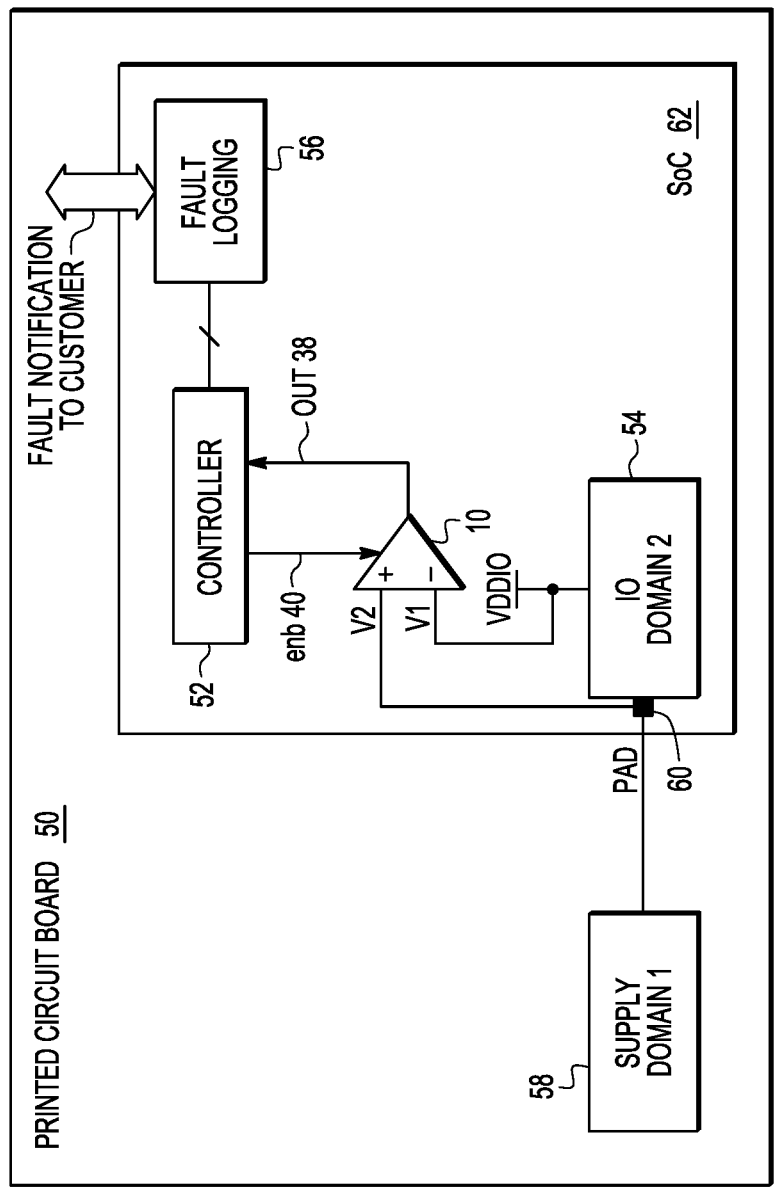
FIG. 2 illustrates, in block diagram form, an SoC containing the comparator circuit of FIG. 1, in accordance with one embodiment of the present invention.

FIG. 2 illustrates, in block diagram form, a printed circuit board (PCB) 50 containing an SoC 62 and a supply domain 58 powering SoC 62. SoC 62 includes an input/output (I/O) domain 54 which has a supply pad 60. Supply domain 58 is coupled to provide power to pad 60. SoC 62 also includes comparator circuit 10 (as was described with respect to FIG. 1), a controller 52, and fault logging circuitry 56. Fault logging circuitry 56 provides a fault notification to users. I/O domain 54 is powered by VDDIO. That is, the circuitry in I/O domain 54 receives VDDIO as a power supply voltage. The inverting input of comparator circuit 10 (corresponding to V1 of FIG. 1) is coupled to VDDIO, and the non-inverting input of comparator circuit 10 (corresponding to V2 of FIG. 1) is coupled to pad 60. Controller 52 provides enb to comparator circuit 10, and receives out 38 from comparator circuit 10. Controller 52 is coupled to provide fault indications to fault logging circuitry 56 in response to assertions of out 38, and fault logging circuitry 56 outputs these fault indications external to SoC 62.

In operation, supply domain 58 is a first power supply domain and I/O domain 54 is a second power supply domain. Ideally, supply domain 58 is coupled to pad 60 to supply a compatible supply voltage to I/O domain 54 for proper circuit operation. If supply domain 58 supplies a supply voltage that is too high, damage may occur to circuitry in I/O domain 54, or, I/O domain 54 may become vulnerable to attacks. Therefore, comparator circuit 10 monitors the voltage on pad 60 with respect to VDDIO. Controller 52, upon powering up, enables comparator circuit 10 by asserting en to 1 and enb to 0, as described above in reference to FIG. 1. Comparator circuit 10 is then in its monitoring state, and out 38 is low (dvss).

While the voltage on pad 60 remains at or below VDDIO, out 38 remains low, and no fault or over-voltage condition is indicated by out 38. During this time, comparator circuit 10 remains in its monitoring state and no DC current is consumed in comparator circuit 10. However, when the voltage on pad 60 goes above VDDIO+Vtp, out 38 is asserted. Controller 52 receives this indication of a fault or over-voltage condition, and provides such indication to fault logging 56. Controller 52 may provide additional information such as time stamping information to be stored along with the fault indication by fault logging circuitry 56. Upon receiving an assertion of out 38, controller 52 can then toggle en so as to reset comparator circuit 10. For example, controller 52 may deassert en to 0, wait a predetermined amount of time, and then again assert en to 1. In the illustrated embodiment, enb is provided to comparator circuit 10, however, in alternate embodiments, en may be provided instead in which comparator circuit 10 would include an additional inverter to receive en and provide enb.

Figure 3:
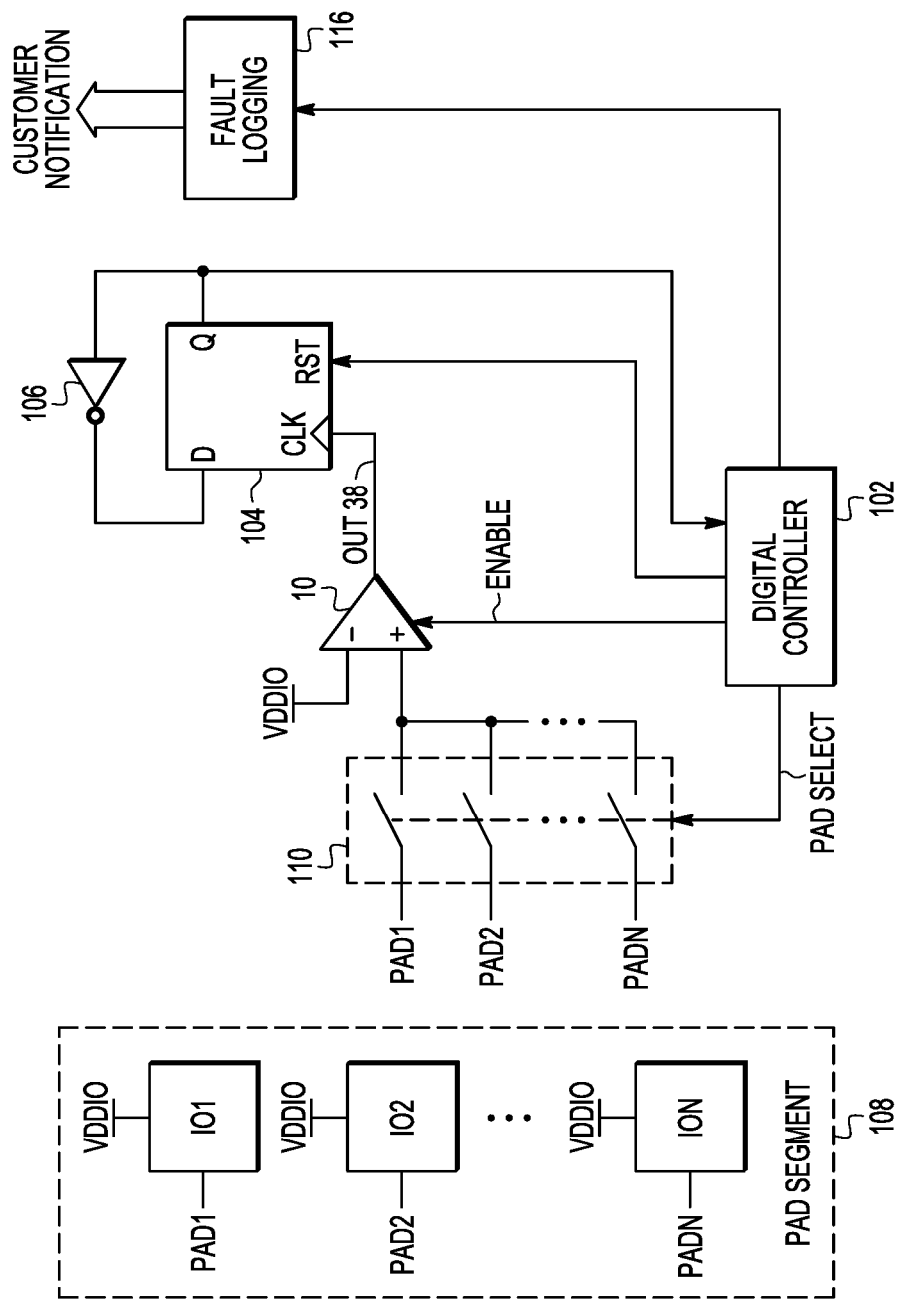
FIG. 3 illustrates, in partial block diagram and partial schematic form, an SoC containing the comparator circuit of FIG. 1 and a pad segment containing multiple pads, in accordance with one embodiment of the present invention.

FIG. 3 illustrates, in partial schematic and partial block diagram form, an SoC 100 in which comparator circuit 10 is used to provide fault (or over-voltage) detection for multiple pads in a pad segment. SoC 100 includes N I/O domains, I/O domain 1 to I/O domain N, and each I/O domain has a corresponding I/O pad, pad 1 to pad N, respectively, and is powered by VDDIO. Pad1 to pad N and I/O domain 1 to I/O domain N correspond to a pad segment 108. SoC 100 also includes a toggle flip flop 104, inverter 106, fault logging circuitry 116, digital controller 102, and switches 110. In SoC 100, VDDIO is coupled to the inverting input of comparator circuit 10 (corresponding to V1 of FIG. 1), and each pad is coupled to the non-inverting input of comparator circuit 10 (corresponding to V2 of FIG. 1) via a corresponding switch from set of switches 110. Therefore, only one selected pad of pad1 to pad N is coupled to the non-inverting input of comparator circuit 10 at a time. Digital controller 102 provides a pad select signal to switches 110 which selects a switch from set of switches 110 to couple a selected pad to the non-inverting input. Note that only one comparator circuit 10 is needed for pad segment 108, in which comparator circuit 10 is shared among all pads in pad segment 108.

Toggle flip flop 104 is a D flip flop configured as a toggle flip flop in which a data output Q of flip flop 104 is coupled to an input of inverter 106, and an output of inverter 106 is coupled to a data input D of flip flop 104. Flip flop 104 also includes a clock input, CLK, and a reset input, RST. Upon asserting RST, such as by providing a logic level 1 to RST, the data output Q is reset to 0. Upon receiving a rising clock edge on CLK, the value at D, which is 1 initially after reset, is clocked into flip flop 104 such that the data output Q is toggled from 0 to 1. Upon a next rising clock edge on CLK, the value at D, which is now 0, is clocked into flip flop 104 such that the data output Q is now toggled from 1 to 0. In the illustrated embodiment, the output of comparator circuit 10, out 38, is coupled to CLK of flip flop 104, and digital controller 102 receives Q and provides a reset input to RST. In this manner, the value of Q is toggled when out 38 is asserted from 0 to 1. Therefore, in one embodiment, data controller 102 first asserts the RST input to cause Q to reset to 0. Upon out 38 going high, indicating a fault, the data output Q of flip flop 104 toggles from 0 to 1. This change in Q is detected by digital controller 102. Digital controller 102, upon detecting a change in Q from 0 to 1, provides information to fault logging circuitry 116 which is configured to log (i.e. store) an indication of the fault occurrence, and may store other information related to the fault, such as, for example, a time stamp and pad number. The time stamp and pad number can also be provided by digital controller 102 to fault logging circuitry 116.

Note that the RST and CLK inputs can be reversed in polarity such that providing a 0 to the RST input resets the flop or a falling edge at CLK changes the state of the data output Q. Also, in alternate embodiments, other edge transition capturing circuitry may be used to implement the signal edge capture and storage other than a toggle flip flop.

Figure 4:
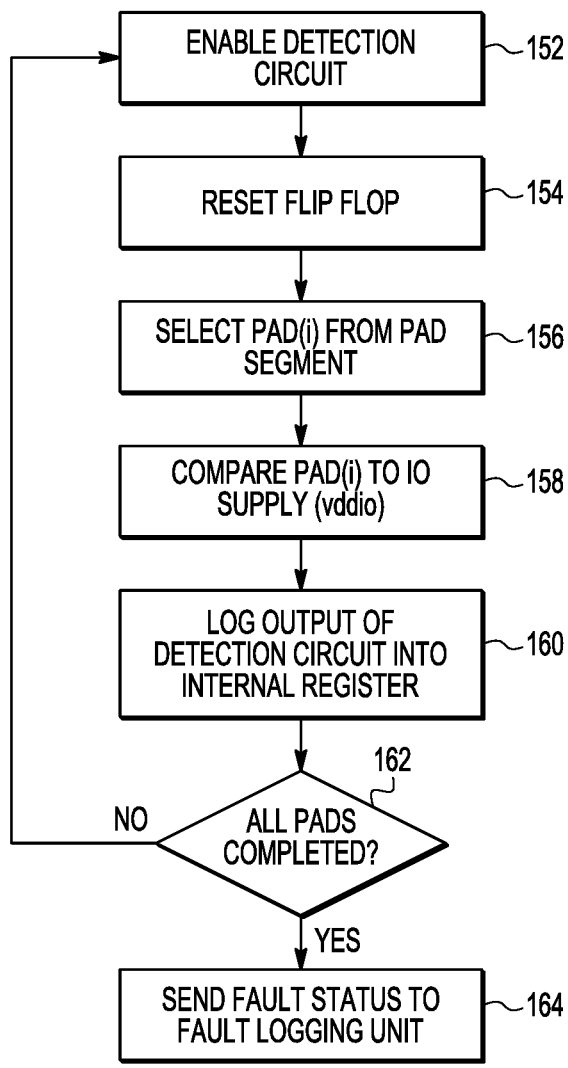
FIG. 4 illustrates, in flow diagram form, a method of operation the SoC of FIG. 3, in accordance with one example of the present invention.

Operation of SoC 100 will be described further in reference to FIG. 4, which describes, in flow diagram form, a method 150 for operating SoC 100. In block 152 of method 150, the detection circuit is enabled. The detection circuit refers to comparator circuit 10 which operates to detect a fault condition in which a pad voltage is incompatible with VDDIO, i.e. that the pad voltage deviates from VDDIO by more than a predetermined margin. Enabling the detection circuit is performed by digital controller 102 which first deasserts the enable signal, en, and then asserts the enable signal, en, in which enb is asserted to a 0. This causes out 38 to reset to 0.

Digital controller 102 resets flip flop 104 in block 154, in which the RST input of flip flop 104 is asserted. This causes the data output Q to reset to 0. In block 156, a pad(i) is selected from pad 1 to pad N, and this pad is coupled to the non-inverting input of comparator circuit 10 via its corresponding switch from set of switches 110. For example, digital controller 102 provides the appropriate pad select signal to switches 110 which closes the switch corresponding to pad(i) by placing that switch into a conductive state.

At this point, pad(i) is coupled to comparator circuit 10 in which the voltage on pad(i) is being monitored (i.e. compared) against VDDIO for a predetermined amount of time (at block 158). If, during this time, the voltage on pad(i) goes above VDDIO+Vtp, out 38 changes from 0 to 1, causing Q to toggle from 0 to 1. If, however, the voltage on pad(i) remains at or below VDDIO during this time, out 38 does not change state and remains at 0. Then, in block 160, the output of the detection circuit, provided by Q, is logged into an internal register of digital controller 102. At decision diamond 162, if all pads have been coupled, in turn, to the non-inverting input of comparator circuit 10, the fault status is sent to fault logging circuitry 116 at block 164. However, if all pads have not been completed, method 150 returns to block 152, in which en is again deasserted and then asserted to reset out 38 to 0, and flip flop 104 is reset to reset Q to 0. A next pad is selected in block 156 to couple to the non-inverting input of comparator circuit 10. This continues until all pads have been completed. Therefore, upon completion of monitoring all pads of pad segment 108, fault logging circuitry 116 can provide notification of the occurrence of faults within SoC 100.

In alternate embodiments, with respect to comparator circuit 10, V2 can be set to a secure or fixed supply and V1 can be the voltage being monitored. In one example, when V1 is greater than V2, operating conditions are safe, but when V1 drops below a certain voltage, set by V2 and any predetermined margin corresponding to Vtp drops, out 38 of comparator circuit 10 switches, indicating a fault or unsafe condition. When V1 drops below V2, it is possible for hackers to introduce a clock glitch which can result in a lack of stability and allow, for example, for code execution to be altered or otherwise affected.

Therefore, by now it can be appreciated how a comparator circuit utilizing feedback can monitor and detect two voltage sources, which may also be close to or above the comparator supply, to determine when an over-voltage or fault condition occurs. For example, the comparator circuit may detect a deviation of one voltage source from another by a predetermined margin. Furthermore, the use of the feedback ensures that while the comparator circuit is monitoring for the deviation of one voltage source from another, no DC current is consumed.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. Also, those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the margin of comparison between V1 and V2 can be changed from Vtp to multiple times Vtp or 0V by using more or fewer circuit elements. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a comparator circuit includes a first transistor have a control electrode coupled to a first input voltage, a first current electrode coupled to a second input voltage, and a second current electrode coupled to a first circuit node; a first inverter coupled to a first voltage supply terminal and having a first input coupled to the first circuit node and an output; a second transistor having a control electrode coupled to the output of the first inverter; and an active resistive element coupled in series between the first circuit node and a first current electrode of the second transistor. In one aspect of the one embodiment, the second transistor has a second current electrode coupled to a second voltage supply terminal configured to provide a lower voltage than the first voltage supply terminal. In another aspect, the circuit further includes a second inverter having a first input coupled to the output of the first inverter and having an output configured to provide an output of the comparator circuit. In a further aspect, the output of the comparator circuit is negated to indicate no fault condition while the second input voltage is less than or equal to the first input voltage. In yet a further aspect, the output of the comparator circuit is asserted to indicate a fault condition when the second input voltage is greater than the first input voltage by a predetermined margin. In an even further aspect, the predetermined margin corresponds to at least a threshold voltage of the first transistor. In another aspect, the second inverter is coupled to a third voltage supply terminal which is less than the second voltage supply terminal, wherein the first and second inverters are configured to level shift a voltage at the first circuit node to provide the output of the comparator circuit. In yet another aspect, the circuit further includes a third transistor coupled between the first transistor and the first circuit node, wherein the third transistor has a first current electrode coupled to the second current electrode of the first transistor, a second current electrode coupled to the first circuit node, and a control electrode coupled to receive an enable signal. In a further aspect, the circuit further includes a fourth transistor having a first current electrode coupled to the first circuit node, a second current electrode coupled to the second voltage supply terminal, and a control electrode coupled to receive the enable signal. In yet a further aspect, the first and third transistors are p-channel transistors and the second and fourth transistors are n-channel transistors.

In another embodiment, a system-on-chip (SoC) includes a detector circuit having a first input coupled to a first voltage supply terminal of the SoC, a second input coupled to an input/output (I/O) pad of the SoC, and an output to provide a fault indicator, wherein the detector circuit includes: a first transistor have a control electrode coupled to the first input, a first current electrode coupled to the second input, and a second current electrode coupled to a first circuit node, a first inverter coupled to a first voltage supply terminal and having a first input coupled to the first circuit node and an output, a second inverter coupled in series with the first inverter and having an output configured to provide the fault indicator, a second transistor having a control electrode coupled to the output of the first inverter, and an active resistive element coupled in series between the first circuit node and a first current electrode of the second transistor; and a controller configured to enable the detector circuit and coupled to receive the fault indicator from the detector circuit. In one aspect of the another embodiment, the SoC further includes first voltage domain circuitry coupled to the I/O pad and the first voltage supply terminal. In another aspect, the detector circuit further includes: a third transistor coupled between the first transistor and the first circuit node, wherein the third transistor has a first current electrode coupled to the second current electrode of the first transistor, a second current electrode coupled to the first circuit node, and a control electrode coupled to receive an enable signal from the controller; and a fourth transistor having a first current electrode coupled to the first circuit node, a second current electrode coupled to the second voltage supply terminal, and a control electrode coupled to receive the enable signal from the controller. In yet another aspect, the fault indicator is negated to indicate no fault condition while a voltage at the I/O pad is less than or equal to a voltage on the first voltage supply terminal, and the fault indicator is asserted to indicate a fault condition when the voltage at the I/O pad is greater than the voltage at the first voltage supply terminal by a predetermined margin. In a further aspect, in response to assertion of the fault indicator, the controller is configured to disable and subsequently enable the detector circuit to reset the fault indicator. In yet a further aspect, the SoC further includes fault logging circuitry coupled to the controller and configured to store indications of asserted fault indicators received by the controller and provide notification of the indications external to the SoC.

In yet another embodiment, a method of fault detection in a System on Chip (SoC) having a plurality of input/output (I/O) pads, each coupled to a first voltage supply terminal, and a detector circuit configured to provide a fault indicator, includes: coupling a selected one of the plurality of I/O pads to a non-inverting input of the detector circuit, wherein the detector circuit includes: an inverting input coupled to the first voltage supply terminal, a first transistor have a control electrode coupled to the first voltage supply terminal, a first current electrode coupled to the selected one of the plurality of I/O pads, and a second current electrode coupled to a first circuit node, a first inverter coupled to a first voltage supply terminal and having a first input coupled to the first circuit node and an output, a second inverter coupled in series with the first inverter and having an output configured to provide a fault indicator, a second transistor having a control electrode coupled to the output of the first inverter, an active resistive element coupled in series between the first circuit node and a first current electrode of the second transistor; and using the detector circuit to compare a voltage at the selected one of the plurality of I/O pads to a voltage at the first voltage supply terminal over a predetermined period of time, wherein the fault indicator is asserted by the detector circuit during the predetermined period of time when the voltage at the selected one of the plurality of I/O pads exceeds the voltage at the first voltage supply terminal by a predetermined margin. In one aspect of the yet another embodiment, the SoC further includes a flip flop having a clock input coupled to the output of the second inverter to receive the fault indicator, a data input coupled to an inverse of a data output, and a reset input, wherein, prior to coupling the selected one of the plurality of I/O pads to the non-inverting input of the detector circuit, the method further includes enabling the detector circuit to reset the fault indicator to a negated value; and resetting the flip flop such that the data output of the data flip flop is reset to a predetermined value. In a further aspect, the method further includes, after the using the detector circuit to compare a voltage at the selected one of the plurality of I/O pads to a voltage at the first voltage supply terminal over a predetermined period of time, the method further includes disabling and re-enabling the detector circuit after the predetermined period of time to reset the fault indicator to the negated value. In yet a further aspect, after re-enabling the detector circuit, the method further includes resetting the flip flop; coupling a second selected one of the plurality of I/O pads to the non-inverting input of the detector circuit; and using the detector circuit to compare a voltage at the second selected one of the plurality of I/O pads to a voltage at the first voltage supply terminal over a predetermined period of time, wherein the fault indicator is asserted by the detector circuit during the predetermined period of time when the voltage at the second selected one of the plurality of I/O pads exceeds the voltage at the first voltage supply terminal by a predetermined margin.

What is claimed is:

1. A comparator circuit comprising:
   a first transistor have a control electrode coupled to a first input voltage, a first current electrode coupled to a second input voltage, and a second current electrode coupled to a first circuit node;
   a first inverter coupled to a first voltage supply terminal and having a first input coupled to the first circuit node and an output;
   a second transistor having a control electrode coupled to the output of the first inverter; and
   an active resistive element coupled in series between the first circuit node and a first current electrode of the second transistor.

2. The circuit of claim 1, wherein the second transistor has a second current electrode coupled to a second voltage supply terminal configured to provide a lower voltage than the first voltage supply terminal.

3. The circuit of claim 1, further comprising a second inverter having a first input coupled to the output of the first inverter and having an output configured to provide an output of the comparator circuit.

4. The circuit of claim 3, wherein the output of the comparator circuit is negated to indicate no fault condition while the second input voltage is less than or equal to the first input voltage.

5. The circuit of claim 4, wherein the output of the comparator circuit is asserted to indicate a fault condition when the second input voltage is greater than the first input voltage by a predetermined margin.

6. The circuit of claim 5, wherein the predetermined margin corresponds to at least a threshold voltage of the first transistor.

7. The circuit of claim 3, wherein the second inverter is coupled to a third voltage supply terminal configured to provide a lower voltage than the first voltage supply terminal, wherein the first and second inverters are configured to level shift a voltage at the first circuit node to provide the output of the comparator circuit.

8. The circuit of claim 1, further comprising:
   a third transistor coupled between the first transistor and the first circuit node, wherein the third transistor has a first current electrode coupled to the second current electrode of the first transistor, a second current electrode coupled to the first circuit node, and a control electrode coupled to receive an enable signal.

9. The circuit of claim 8, further comprising:
   a fourth transistor having a first current electrode coupled to the first circuit node, a second current electrode coupled to a second voltage supply terminal, and a control electrode coupled to receive the enable signal.

10. The circuit of claim 9, wherein the first and third transistors are p-channel transistors and the second and fourth transistors are n-channel transistors.

11. A system-on-chip (SoC) comprising:
    a detector circuit having a first input coupled to a first voltage supply terminal of the SoC, a second input coupled to an input/output (I/O) pad of the SoC, and an output to provide a fault indicator, wherein the detector circuit includes:
      a first transistor have a control electrode coupled to the first input, a first current electrode coupled to the second input, and a second current electrode coupled to a first circuit node,
      a first inverter having a first input coupled to the first circuit node and an output,
      a second inverter coupled in series with the first inverter and having an output configured to provide the fault indicator,
      a second transistor having a control electrode coupled to the output of the first inverter, and
      an active resistive element coupled in series between the first circuit node and a first current electrode of the second transistor; and
    a controller configured to enable the detector circuit and coupled to receive the fault indicator from the detector circuit.

12. The SoC of claim 11, further comprising first voltage domain circuitry coupled to the I/O pad and the first voltage supply terminal.

13. The SoC of claim 11, wherein the detector circuit further includes:
    a third transistor coupled between the first transistor and the first circuit node, wherein the third transistor has a first current electrode coupled to the second current electrode of the first transistor, a second current electrode coupled to the first circuit node, and a control electrode coupled to receive an enable signal from the controller; and a fourth transistor having a first current electrode coupled to the first circuit node, a second current electrode coupled to a second voltage supply terminal, and a control electrode coupled to receive the enable signal from the controller.

14. The SoC of claim 11, wherein the fault indicator is negated to indicate no fault condition while a voltage at the I/O pad is less than or equal to a voltage on the first voltage supply terminal, and the fault indicator is asserted to indicate a fault condition when the voltage at the I/O pad is greater than the voltage at the first voltage supply terminal by a predetermined margin.

15. The SoC of claim 14, wherein, in response to assertion of the fault indicator, the controller is configured to disable and subsequently enable the detector circuit to reset the fault indicator.

16. The SoC of claim 15, further comprising fault logging circuitry coupled to the controller and configured to store indications of asserted fault indicators received by the controller and provide notification of the indications external to the SoC.

17. A method of fault detection in a System on Chip (SoC) having a plurality of input/output (I/O) pads, each coupled to a first voltage supply terminal, and a detector circuit configured to provide a fault indicator, the method comprising:

coupling a selected one of the plurality of I/O pads to a non-inverting input of the detector circuit, wherein the detector circuit includes:

an inverting input coupled to the first voltage supply terminal, a first transistor have a control electrode coupled to the first voltage supply terminal, a first current electrode coupled to the selected one of the plurality of I/O pads, and a second current electrode coupled to a first circuit node, a first inverter having a first input coupled to the first circuit node and an output, a second inverter coupled in series with the first inverter and having an output configured to provide the fault indicator, a second transistor having a control electrode coupled to the output of the first inverter, an active resistive element coupled in series between the first circuit node and a first current electrode of the second transistor; and using the detector circuit to compare a voltage at the selected one of the plurality of I/O pads to a voltage at the first voltage supply terminal over a predetermined period of time, wherein the fault indicator is asserted by the detector circuit during the predetermined period of time when the voltage at the selected one of the plurality of I/O pads exceeds the voltage at the first voltage supply terminal by a predetermined margin.

18. The method of claim 17, wherein the SoC further includes a flip flop having a clock input coupled to the output of the second inverter to receive the fault indicator, a data input coupled to an inverse of a data output, and a reset input, wherein, prior to coupling the selected one of the plurality of I/O pads to the non-inverting input of the detector circuit, the method further comprises:

enabling the detector circuit to reset the fault indicator to a negated value; and resetting the flip flop such that the data output of the data flip flop is reset to a predetermined value.

19. The method of claim 18, further comprising, after the using the detector circuit to compare a voltage at the selected one of the plurality of I/O pads to a voltage at the first voltage supply terminal over a predetermined period of time, the method further comprises:

disabling and re-enabling the detector circuit after the predetermined period of time to reset the fault indicator to the negated value.

20. The method of claim 19, wherein after re-enabling the detector circuit, the method further comprises:

resetting the flip flop;

coupling a second selected one of the plurality of I/O pads to the non-inverting input of the detector circuit; and using the detector circuit to compare a voltage at the second selected one of the plurality of I/O pads to a voltage at the first voltage supply terminal over a predetermined period of time, wherein the fault indicator is asserted by the detector circuit during the predetermined period of time when the voltage at the second selected one of the plurality of I/O pads exceeds the voltage at the first voltage supply terminal by a predetermined margin.

* * * * *